United States Patent [19]

May

[11] Patent Number: 4,482,979
[45] Date of Patent: Nov. 13, 1984

[54] VIDEO COMPUTING SYSTEM WITH AUTOMATICALLY REFRESHED MEMORY

[76] Inventor: George A. May, R.R. 1, E. Sooke Rd., Sooke, British Columbia, Canada, V0S 1 N0

[21] Appl. No.: 345,820

[22] Filed: Feb. 4, 1982

[51] Int. Cl.³ ............................................. G09G 1/16
[52] U.S. Cl. .................................. 364/900; 340/750; 340/709
[58] Field of Search ............... 364/900, 200; 340/798, 340/799, 711, 750; 365/222

[56] References Cited

U.S. PATENT DOCUMENTS

| | | | |
|---|---|---|---|
| 3,699,531 | 10/1972 | Heiman | 364/200 |
| 3,737,879 | 6/1973 | Green | 365/222 |
| 3,836,902 | 9/1974 | Okuda | 340/324 AD |
| 3,972,040 | 7/1976 | Hilsum | 340/324 M |
| 4,112,513 | 9/1978 | Elsner | 365/222 |
| 4,117,469 | 9/1978 | Levine | 340/711 |
| 4,125,873 | 11/1978 | Chesarek | 364/900 |
| 4,181,933 | 1/1980 | Benysek | 364/200 |
| 4,197,590 | 4/1980 | Sukonick et al. | 364/900 |
| 4,232,376 | 11/1980 | Dion et al. | 340/798 |
| 4,333,167 | 6/1982 | McElroy | 365/222 |
| 4,379,293 | 4/1983 | Boisvert et al. | 340/750 |
| 4,404,554 | 9/1983 | Tweedy, Jr. et al. | 340/750 |
| 4,418,343 | 11/1983 | Ryan et al. | 340/799 |

Primary Examiner—Charles E. Atkinson
Assistant Examiner—Michael R. Fleming
Attorney, Agent, or Firm—Majestic, Gallagher, Parsons & Siebert

[57] ABSTRACT

A video computing system is disclosed having an automatically refreshed memory. The computing system includes a dynamic memory connected to a cathode ray tube. A cathode ray tube controller is also connected to the memory and is capable of sequentially generating addresses, corresponding to locations in the memory. A central processor is connected to the dynamic memory and operates on an alternating, two phase fetch and execute cycle. During the fetch phase, the central processor has access to the dynamic memory, while during each execute phase, when computing operations are carried out, access to the dynamic memory is prevented. In contrast, during the execute phase, the cathode ray tube controller is permitted direct access to the memory enabling the video information stored therein to be supplied to the cathode ray tube. The sequential and continuous reading of the memory during each execute phase functions to continually refresh the dynamic memory.

11 Claims, 4 Drawing Figures

VIDEO COMPUTING SYSTEM WITH AUTOMATICALLY REFRESHED MEMORY

BACKGROUND OF THE INVENTION

The subject invention relates to a new and improved video computing system having an automatically refreshed memory. More particularly, a video computing system is disclosed having a dynamic random access memory which is automatically refreshed without the benefit of separate refresh circuitry. In addition, the system is arranged such that the normal operation of the central processing unit need not be interrupted to carry out the refresh sequence.

In prior art computers, a variety of memory means were developed to store information. Typically, memories consist of a plurality of interconnected semiconducter devices each capable of storing a charge representing a bit of information Certain types of memories, called static memories, are capable of holding these charges for an indefinite period. Static memories however, consume a high level of power, are relatively slow, and are expensive to manufacture.

Accordingly, in the prior art, dynamic memories were developed which require less power and are relatively faster in operation. Information, stored in the form of electrical charges, may be randomly accessed from the memory. Unlike a static memory, however, the electrical charges in a conventional random access memory (RAM) decay over a period of time and eventually become unreadable. Stated differently, when the voltage level of a charge held in the memory decays below a certain threshold, it can no longer be distinguished from the off or null state. The decay rates of RAM's vary but are typically in the millisecond range. To prevent the charges in the RAM's from decaying to an unreadable level, refresh circuitry must be provided. More particularly, in the prior art, various refresh circuits were developed to maintain charges on the dynamic RAM's.

Memory locations can be refreshed by a normal read process In a typical dynamic RAM, the memory locations are arranged in a matrix configuration of columns and rows such that each position in the memory is defined by a unique column and row address. Matrix memories are generally designed such that the reading of any particular location will function to refresh all the locations in either the particular row or column which was selected. Thus, an entire matrix memory can be refreshed by reading either all the rows or columns. Accordingly, in the prior art, refresh circuits were developed which insure that all the columns or rows of the memory are read within the decay period.

During a refresh operation, direct access to the memory, by the central processing unit (CPU), must be prevented. Thus, at the beginning of each refresh cycle, a computer interrupt signal is generated preventing the CPU from accessing the memory until the refresh operation is complete. The necessity of refreshing dynamic memories therefore results in a significant reduction in computer processing speed since the access to memory by the CPU must be continuously interrupted.

In order to reduce this loss of computing speed, a variety of intelligent refresh circuits have been developed. For example, U.S. Pat. No. 3,737,879 issued June 5, 1973 to Greene, et al. discloses an intelligent refresh circuit having a memory matrix. In the latter circuitry, the condition of the memory is monitored and the refresh operation is carried out only when necessary. By this arrangement, the percentage of time which the CPU is denied access to the memory is reduced.

Another example of intelligent refresh circuitry is disclosed in U.S. Pat. No. 4,112,513, issued Sept. 5, 1978 to Elsner. In the latter patent, a system is disclosed which selectively refreshes particular sections of the memory, permitting CPU access to the remainder of the memory. However, as can be appreciated, the latter prior art systems still deny full access to the memory. Further the prior art systems require fairly complex circuitry. Accordingly, it would be desirable to provide a new and improved computing system which does not require the interruption of the central processing unit and eliminates the use of refresh circuitry thereby reducing the cost and complexity of the system.

Many computing systems now utilize a cathode ray tube (CRT) as an input/output device. A variety of CRT's have been developed for various uses. For example, vector oscilloscopes, having a high persistence phosphor, are suitable for some systems However, more frequently, raster scanning oscilloscopes are used due to their low cost and high reliability. Raster scan oscilloscopes are well known in the art and need not be described in detail. Briefly, a raster scan oscilloscope includes a cathode ray tube which emits a beam of electrons onto a phosphor coated screen having a low persistance. Shifting magnetic fields cause the electron beam to sweep across the phosphor coated screen in regular horizontal lines. At the end of a full screen sweep, the electron beam is returned to its starting point to begin sweeping again. Since the phosphor coating has a low persistence, the beam must continually sweep the screen to maintain the visual image.

The information to be displayed on the video screen is typically contained in the system memory. One method of storing and displaying the video information is to divide each horizontal scan line into a number of individual points or pixels. Each pixel can be represented by one location in the computer memory. This arrangement is frequently called a bit map. Data stored in memory is transfered to the CRT and used to modulate the electron beam to produce the video image.

In most prior art raster scan systems, a controller is provided which sequentially generates addresses corresponding to the locations in the computer memory where the video information is stored. The controller must have priority access to the memory to obtain the video information stored therein for refreshing the image on the CRT. Accordingly, prior art systems are designed such that when information is required, an interrupt signal is generated preventing the CPU from accessing any data in the memory. During the interrupt period, the controller is permitted direct memory access to the information contained in the dynamic memory. Typically, the information is read out of memory a line at a time and output on the video screen. As can be appreciated, the interrupting of the CPU to obtain video information results in loss of computing speed and power. Thus, it would be desirable to provide a new and improved system where computing speed is not sacrificed by the need for direct memory access by the video system.

SUMMARY OF THE INVENTION

Accordingly, it is an object of the subject invention to provide a new and improved video computing system having an automatically refreshed dynamic memory.

It is another object of the subject invention to provide a new and improved computing system in which the electrical charges in the dynamic memory are prevented from decaying below a readable level without utilizing separate refresh circuitry.

It is another object of the subject invention to provide a new and improved computing system wherein the dynamic memory may be refreshed without interrupting the function of the CPU.

It is still a further object of the subject invention to provide a new and improved video computing system wherein direct access to the dynamic memory by the display permitted without losing any computing speed.

In accordance with these and many other objects, the subject invention provides for a new and improved computing system for use with a display means wherein the memory is automatically refreshed. More particularly, in the subject system, a dynamic memory means is provided having storage locations arranged in a matrix configuration having rows and columns. A particular location of the memory is defined by the intersection between a column and a row. The memory can be refreshed by reading all of the addresses corresponding to any particular row or column depending upon the memory design selected.

A display means, such as a cathode ray tube, operating in a raster scan manner, is connected to the memory. A controller means is connected to the memory and is capable of sequentially generating addresses corresponding to locations in the memory. More particularly, the addresses generated by the controller are multi-bit binary numbers, wherein the low order bits correspond to the addresses of the rows in memory, while the higher order bits correspond to the addresses of the columns. By this arrangement, every possible row address is sequentially generated for each new column address.

In accordance with the subject invention, a central processing means is provided which is operatively connected to the dynamic memory. The central processing means operates on an alternating, two phase, fetch and execute cycle wherein during each fetch phase, the central processing unit has access to the information in the memory. In the execute phase, when computing operations are carried out, access to the dynamic memory by the CPU is prevented. In contrast, during the execute phase, the controller means is given direct access to the memory, enabling video information stored in the dynamic memory to be accessed and supplied to the display means.

The unique arrangement of the subject invention permits continual refreshing of the dynamic memory. More particularly, because the video information is accessed in a regular and continuous manner, every row address in the memory is sequentially accessed. The length of time it takes to address every row depends upon a variety of factors including the size of the memory, the speed of the raster scan and the amount of video information in each scan line. In the illustrate. embodiment of the subject invention, the memory will be refreshed every 200 microseconds. This is at least an order of magnitude faster than the typical charge decay time, thereby insuring no data loss.

At the end of each full screen sweep, the address counter of the controller is reset to the starting location to permit continuous refreshing of the video image. Accordingly, the number of rows in the dynamic memory must be less than the largest address generated by the controller to insure that the entire dynamic memory will be refreshed at least once during each video refresh cycle. Since typical dynamic memories are defined by a matrix configuration, having multiple columns, the atter requirement is easy to satisfy. More importantly, due to the unique configuration of the subject refresh system, a memory having significant storage space beyond that which is necessary to store the video information can be utilized.

Further objects and advantages of the subject invention will become apparent from the following detailed description, taken in conjunction with the drawings in which:

DETAILED DESCRIPTION OF THE PREFERRED EMBODIMENT

Figure 1:
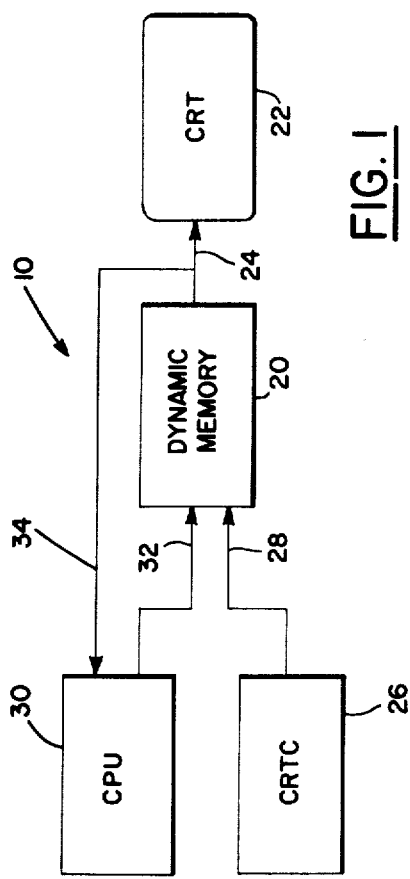
FIG. 1 is a block diagram of the new and improved video coputing system, with automatically refreshed memory, of the subject invention.

Referring to FIG. 1, there is shown a general block diagram illustrating the new and improved video computing system 10 of the subject invention. The video computing system 10 includes a dynamic random access memory 20 capable of storing information. A number of dynamic memories are found in the prior art and it is intended that the subject system be compatible therewith. As pointed out above, due to the leakage of currents, the semi-conductor devices in a dynamic RAM gradually lose their charge if they are not periodically refreshed. In accordance with the subject invention, no separate refresh circuitry is necessary to maintain the charges in the dynamic memory 20.

The subject invention further includes a display means 22 operating with a raster-type, scan format. While a variety of display means operating on a raster scanning format are available or are being commercially developed, a conventional cathode ray tube oscilloscope has been selected for illustration since it is well known in the art and need not be described in detail. As mentioned above, a raster scan oscilloscope includes a cathode ray tube which emits a beam of electrons onto a screen having a phosphor coating of low persistance. Shifting magnetic fields cause the electron beam to sweep across the phosphor coated screen in regular horizontal lines or rasters. After completing an entire screen sweep, the electron beam is returned to its starting point to continue the sweeping sequence. Due to the low persistance of the phosphor, the electron beam must continually sweep the screen to maintain the visual image. Dynamic memory 20 is connected to the CRT by a data-out line 24.

In accordance with the subject invention, a controller means such as a cathode ray tube controller (CRTC) 26 is provided and is connected to the dynamic memory 20 along address line 28. The CRTC sequentially generates addresses corresponding to locations in memory where the video information, to be displayed on the CRT 22, is stored. As described more fully hereinbelow, the video information is stored in memory in a bit map format, arranged in a regular, ordered manner. Accordingly, the CRTC 26 is operative to generate sequential addresses from a starting point to a finishing point, corresponding to the bit map in memory. When the last address of the bit map has been generated by the CRTC, the counter will be reset to the initial starting address so that the CRT will be supplied with the initial bit of information.

In accordance with the subject invention, a central processing unit (CPU) 30 is provided which operates on a two phase clocking system. More particularly, the CPU operates on an alternating, fetch and execute cycle wherein during the fetch phase, the CPU is permitted access to the dynamic memory means along address line 32. Information requested by the CPU is returned thereto along branch 34 of data-out line 24. In contrast, during the execute cycle, the CPU does not reference the dynamic memory 20 or any other devices which might be on the address bus. Rather, during the execute phase, the CPU will carry out any necessary computing operations. When the CPU is in the execute phase, and access to the dynamic memory is blocked, the CRTC 26 is given direct access to the dynamic memory 20. Thus, during every execute phase, the CRTC can address the bit map in the memory enabling the video information to be supplied to the CRT 22 along data-out line 24. The 6800 family of CPU's, manufactured by Motorola Corp., for example, operate on an alternating two phase clock system, and are suitable for use with the subject invention.

As discussed above, the act of reading information from a memory causes that memory location to be refreshed. Accordingly, the sequential, regular and continuous reading of the memory by the CRTC during every execute cycle functions to continually refresh the memory without any refresh circuitry. Further, there is no requirement for the separate interruption of the CPU to carry out the refresh operation as required in the prior art. In addition, since the CPU is designed to operate in a two phase alternating mode, it need never be interrupted to permit separate access to the video information by the CRTC as in prior art systems. Accordingly, the subject computing system not only eliminates the need for refresh circuitry, but performs the refresh operation, and permits direct memory access by the CRTC with no speed penalties to the central processing unit.

Figure 3:
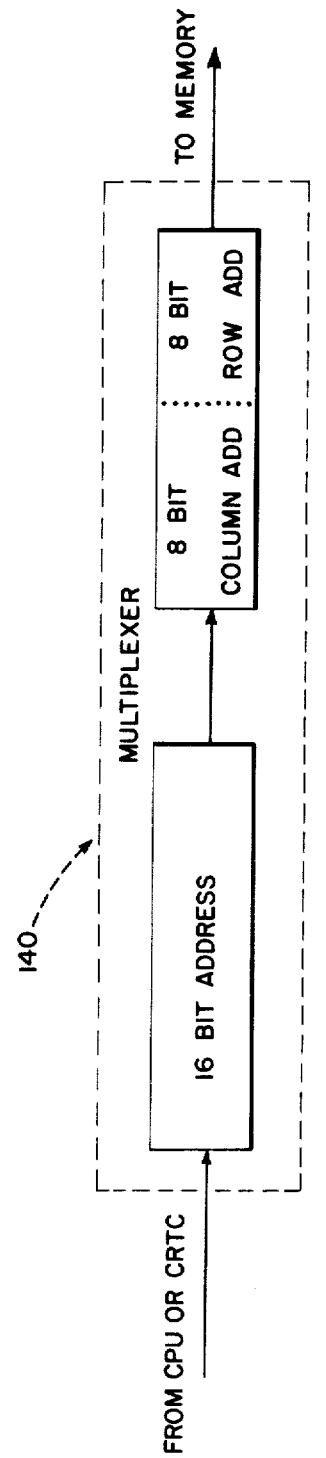
FIG. 3 is a block diagram illustrating the addressing system of the video computing system of the subject invention.
Figure 2:
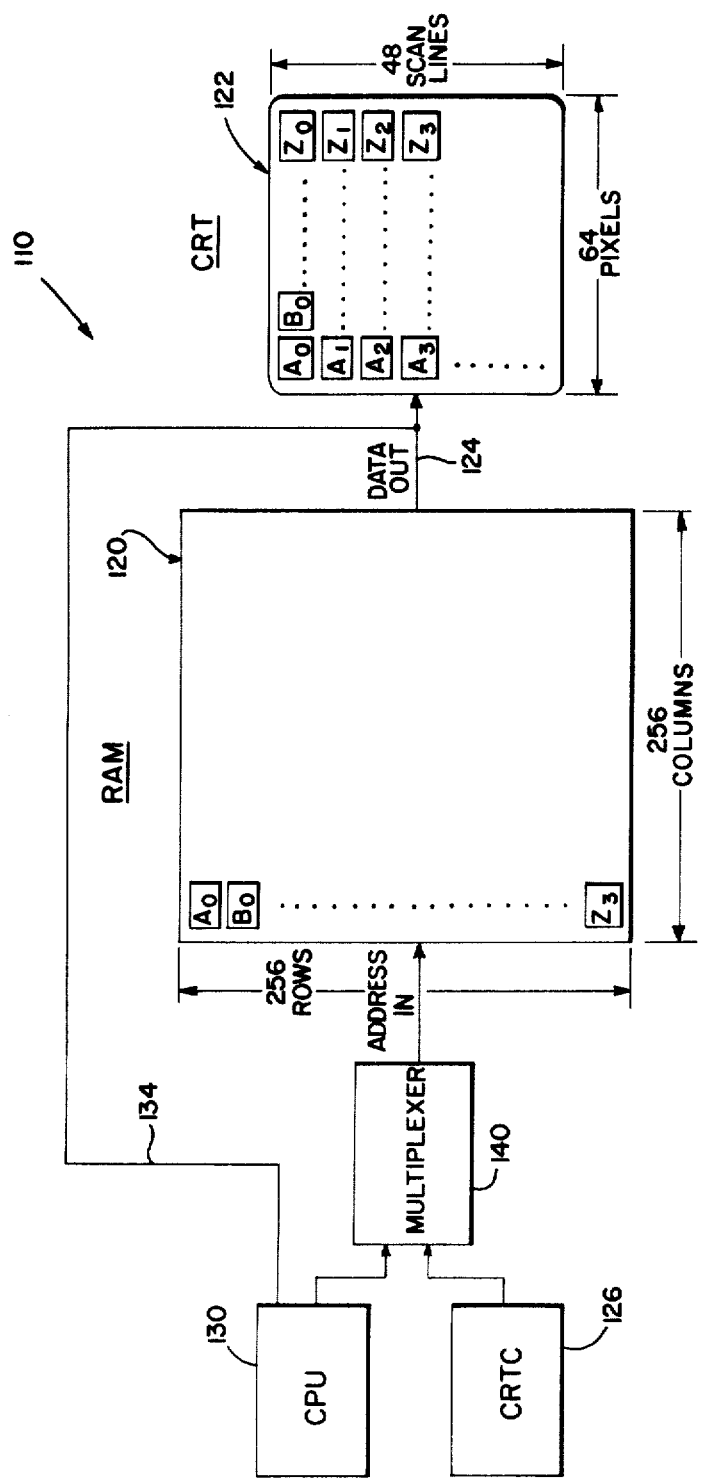
FIG. 2 is a block diagram of a simplified, exemplary version of the new and improved video computing system of the subject invention.
Figure 4:
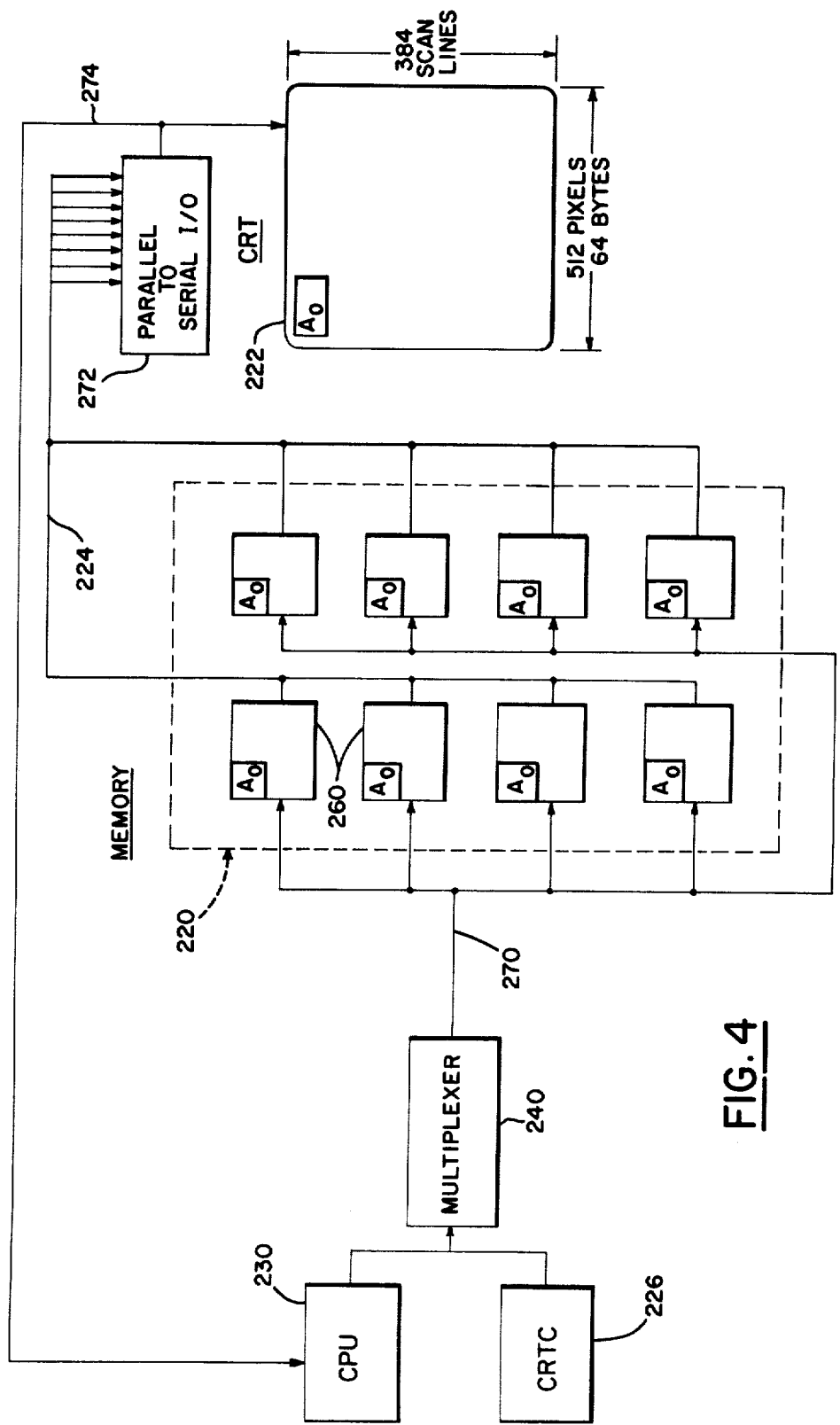
FIG. 4 is a detailed block diagram of the preferred embodiment of the video computing system of the subject invention.

Referring to FIGS. 2 and 3, a simplified embodiment of the subject invention is illustrated to facilitate the explanation of the subject invention. While an operating device could be fabricated based on the simplified embodiment, FIG. 4 illustrates one preferred embodiment whose advantages will be described more fully hereinbelow. FIG. 2 does, however, illustrate a basic construction upon which numerous configurations such as the preferred embodiment shown in FIG. 4, can be developed. The scope of the subject invention is intended to cover all of the illustrated embodiments.

Referring to FIG. 2, one construction implementing the computing system 110 of the subject invention as illustrated. More particularly, a dynamic random access memory (RAM) 120 is shown having 64K storage locations. RAM 120 is arranged in a matrix configuration having 256 rows and 256 columns. The location of any particular position in the RAM is defined by the intersection between one of the rows and one of the columns. Information can be written into memory or read from memory by supplying both a row and column address thereto as described more fully hereinbelow. Many dynamic RAM's of the type described above are now found in the prior art.

A raster scan CRT 122 is connected to the dynamic RAM 120 along data-out line 124. As discussed above, in a raster scan oscilloscope, the video screen is divided into a plurality of horizontal scan lines, along which an electron beam is caused to traverse. Typically, the electron beam will start in a corner, for example, the upper left hand corner in the figure, and traverse from left to right along a horizontal line. At the right hand end of the line, the beam will abruptly return to the left hand side of the screen and simultaneously drop down and begin traversing the horizontal line immediately below, from left to right. This scanning pattern continues all the way down the screen. In the illustrated embodiment, the screen is divided into 48 horizontal scan lines. When the beam has traversed all 48 scan lines, it is returned to its initial starting position.

In order to process and store the video information, each horizontal scan line is broken up into bits or pixels. The number of pixels per line affects the resolution and clarity of the video image. More particularly, as the number of divisions or pixels increases per line, details of the video image can be enhanced and resolution increased. For the simplified illustrated example in FIG. 2, each horizontal scan line is divided into 64 pixels which would yield a relatively low resolution picture. Since there are 48 scan lines each divided into 64 pixels, the illustrated CRT screen includes a total of 3,072 individual pixels.

By dividing the screen into individual pixel locations, information regarding the color, brightness and hue can be assigned to each location. Assuming the CRT is capable of color reproduction, the information corresponding to each pixel can be used to modulate the electron beam, when it arrives at that location, to produce the desired picture qualities. As can be appreciated, the amount of data relating to color reproduction will take up a relatively large amount of storage space in memory and add an element of complexity to the present explanation which is unnecessary to the understanding of the subject invention. Accordingly, the subject invention will be described with reference to a black and white CRT wherein each pixel location is defined by a light or dark color representd in memory by either an on or off condition. It is to be understood however that the scope of the subject invention is intended to include variations wherein the coding of the pixels is expanded to include additional information such as grey scale or color.

Accordingly, in the example illustrated in FIG. 2, each pixel on the CRT can be represented by a single bit in the dynamic memory. This arrangement is often referred to as a bit map in the prior art. In the illustrated example, the pixel, denoted as $A_0$ on the CRT screen, is located at the position in memory defined by the intersection between the first row and first column. As noted above, the video information stored in memory will be represented by either a zero or positive charge, corresponding to the light and dark conditions of that pixel on the video screen. The video information is used to modulate the electron beam when it is aligned with its associated pixel.

Similarly, the second pixel $B_0$, located to the right of the first pixel $A_0$, along the first horizontal scan line, can be represented in memory at the position defined by the intersection between the second row and first column. The remaining 62 pixels of the first horizontal scanline can be represented in memory in rows 3 through 64 of the first column. The remainder of the pixels of the screen are similarly mapped out within the memory. For example, pixel $A_1$, located at the left hand edge of the second scan line is represented at the intersection between row 65 and the first column. Pixel $Z_3$, located at the right hand edge of the fourth scan line is the 256th pixel and would be represented at the intersection between the first column and the 256th row. Thus, in the illustrated embodiment, the mapping of four out of the 48 scan lines requires all 256 rows in a single column of memory.

The remaining 44 horizontal scan lines can be mapped out in eleven additional columns. Thus, in the simplified embodiment, the entire bit map can be laid out in memory in the first twelve columns, with the remaining 244 columns being available for use in information processing by the CPU.

As discussed above, CPU 130 operates on an alternating, two phase, fetch and execute cycle. During the fetch cycle, the CPU is given access to the memory for obtaining information contained therein. If the selected operation is intended to alter the information in the bit map, the CPU will access that area in memory where the video information is stored. In contrast, if calculations or other computations are to be carried out, the remaining work space of the RAM can be utilized.

During the fetch phase, the address generated by the CPU is supplied to the RAM and information at that location is output along branch 134 of data-out line 124. In the preferred embodiment of the subject invention, the addresses are supplied to the RAM by means of a multiplexer means 140. Multiplexer 140 is adapted to receive addresses generated by both the CPU and CRTC depending on the operating phase of the CPU. A variety of address schemes may be utilized. In the illustrated embodiment, an address scheme is disclosed suited for a dynamic RAM having a matrix configuration with 256 columns and 256 rows. In the address scheme, a particular location in memory is accessed by specifying a unique column and a unique row. Any one of 256 unique addresses can be specified with eight binary bits of information.

Referring to FIG. 3, the addressing scheme of the preferred embodiment of the subject invention is illustrated. More particularly, it is intended that both the CPU and the CRTC supply addresses to multiplexer 140 in the form of a sixteen bit binary stream. From the standpoint of the CPU, which is permitted access to any bit within the memory, the sixteen bit binary address can take on any value. The constraints imposed on the addressing of the CRTC will be described more fully hereinbelow.

Multiplexer 140 functions to divide the sixteen bit binary address supplied from either the CPU or the CRTC into eight lower order bits and eight higher order bits. The eight lower order bits are then used to address the 256 rows in the memory. The higher order eight bits can be used to address the 256 columns. It should be noted that the particular number of bits and the use of high and low order bits to designate either the column or rows are merely selected for illustrative purposes, and may be varied by one skilled in the art and still fall within the scope of the subject invention.

In a conventional dynamic RAM, the row and column addresses are supplied one after the other, rather than simultaneously, and control impulses are used for strobing these addresses into the RAM. This addressing operation is well known in the art and need not be described. As can be appreciated, when the memory is supplied with a unique column and a unique row address, the intersection thereof will define a particular location in memory which is output on the data bus 124. Thus, during the fetch cycle of the CPU, a sixteen bit binary address is supplied to multiplexer 140 which in turn sequentially supplies an eight bit row and eight bit column address to the memory, for reading or writing a particular bit.

As discussed above, the CRTC is designed to sequentially generate addresses corresponding to the locations in memory of the video information. In the illustrated example, bit $A_0$, which is located at the intersection between the first column and the first row, may be addressed with sixteen binary zeros. Stated differently, the address for the first row will consist of eight zeros and the address for the first column will also consist of eight zeros. The addressing of the remainder of the rows and columns merely follows the binary counting sequence such that the 256th address is represented by eight ones.

In operation, the CRTC sequentially generates sixteen bit numbers. Each sequential group of 256 sixteen bit addresses will include all the 256 row addresses. For example, during the generation of the first 256 addresses, the lower order eight bits will cycle from zero to binary 255, while the higher order eight bits will remain all zeros. The address corresponding to the 257th data position requires a "one" in the least significant bit of the higher order address, and eight zeros in the lower order row address. The following 255 addresses are obtained when the lower order bits cycle from 1 to 255 binary, with the higher order bits remaining constant. Thus, all 256 row addresses are sequentially generated prior to the generation of a new column address.

In the illustrated embodiment, the video bit map is stored in the first twelve columns and includes 3,072 memory locations. When the sixteen bit address generated by the CRTC reaches 3,072 binary, the CRTC counter is reset to its initial starting position. Since all memory locations are refreshed by the reading of one entire column, the dynamic memory will be refreshed twelve times (corresponding to twelve columns) every time the image on the video screen has been refreshed, as more fully described hereinbelow.

In operation, during the execute cycle of the CPU 130, the CRTC is given direct access to the memory 120 through multiplexer 140. Accordingly, during each execute cycle, the address supplied to the dynamic RAM causes a bit of information to be gated along data-out line 124 to the CRT 122. The bit of information is used to modulate the electron beam at that location. Since video information is required to modulate the electron beam as it sweeps across the screen, the CRTC will sequentially generate the addresses necessary to access that video information in the bit map. As can be appreciated, the CPU does not have to be interrupted in order to access this information.

Having explained the operation of the subject video system, its ability to refresh the entire dynamic RAM will now be discussed. As mentioned above, a dynamic RAM can be refreshed by writing or reading the information in memory. Further, in the type of matrix RAM illustrated, the reading of any particular row functions to refresh all the locations in that row. Thus, the reading of all 256 row addresses of the RAM results in the entire RAM being refreshed.

In accordance with the subject invention, due to the continuous, regular and sequential accessing of the video bit map by the CRTC, the entire memory is refreshed without requiring refresh circuitry. More particularly, and as discussed above, the bit map and addressing scheme of the CRTC are arranged such that all 256 row addresses will be accessed for each column address. Since the CRTC sequentially generates the sixteen bit address, all the row addresses are accessed in a continuous and repetitive manner. In the illustrated embodiment, all 256 row addresses will be generated by the CRTC every four scan lines. Thus, where there are 48 scan lines in the screen, the memory will be refreshed twelve times for every full scan sweep.

The unique arrangement of the subject invention functions not only to refresh the area in memory where the bit map is located, but in addition, refreshes the remaining memory which is available for calculation and storage. Thus, merely by accessing all the row addresses in memory, the RAM will be sequentially and regularly refreshed without separate circuitry or the interruption of the CPU for an independent refresh operation. Further, since the CRTC is only given direct access during the execute phase, the CPU's access during the fetch phase is never interrupted.

Referring now to FIG. 4, the preferred embodiment of the video computing system 210 of the subject invention is illustrated. In the preferred embodiment, both the dynamic memory 220 and CRT 222 have been expanded in size. More particularly, the CRT is provided with 384 horizontal scan lines. Further, each horizontal scan line is divided into 512 bits, or pixels. The 512 pixels are grouped in 64 bytes of eights bits each, to facilitate information transfer, as described hereinbelow.

Memory 220 has also been expanded to accommodate the additional storage locations necessary to hold the bit map of the expanded CRT. More particularly, memory 220 consists of eight dynamic RAMS each capable of holding 64K bits of information. Each of the eight RAM's (labeled as 260) are identical to the entire dynamic memory illustrated and described in the previous, simplified embodiment. Accordingly, each RAM 260 in memory 220 is defined by a matrix configuration having 256 rows and 256 columns. Any position in each RAM is defined by the intersection between a unique column and a unique row. As in the previous embodiment of the subject invention, a two phase alternating CPU 230 is provided having fetch and execute cycles. Similarly, a CRTC 226 is provided for sequentially generating addresses corresponding to locations in memory where the video information is stored.

Multiplexer 240 functions to receive a sixteen bit address from either the CPU 230 or the CRTC 226. Similar to the first embodiment, multiplexer 240 divides each sixteen bit address into low and high order groups of eight bits, representing the row and column addresses. These addresses are sequentially supplied to each RAM along address bus 270. The address bus is branched such that the addresses generated by multiplexer 240 are supplied to each RAM simultaneously.

As in the previously described embodiment, during each execute cycle of the CPU 230, the CRTC 226 is given direct access to the memory. More particularly, the address generated by the CRTC is supplied to the memory via multiplexer 240. Since an identical address is supplied to each of the RAM's, one data bit in each RAM (at the specified location) will be gated to the data-out bus, which consists of eight individual, parallel lines 224, running outwardly from each of the RAM's. The eight parallel lines 224 feed into a parallel to serial input/output converter 272, where the eight bits of information are converted from parallel format to a serial format. The eight serial bits (or byte) of information can then be supplied to the CRT. Stated differently, for each address generated by the CRTC, an entire byte of information will be supplied to the CRT 222. This arrangement significantly increases the speed of operation of the subject system and permits enhanced resolution and clarity for the video images. Since each horizontal raster contains 64 bytes, the scanning of four lines will require the generation of 256 addresses. As in the simplified embodiment, due to the sequential generation of addresses by the CRTC, all of the 256 row addresses will be accessed thereby refreshing the entire memory. In the preferred embodiment, the entire memory can be refreshed every 200 microseconds, which is approximately an order of magnitude faster than required.

As discussed above, for each address generated by the CRTC, a byte of information will be supplied to the data bus. Similarly, for each address generated by the CPU, a byte will be accessed and supplied, in serial format, back to the CPU along data line 274. A computing operation which requires the altering of a single bit of information in a particular byte may be carried out at the CPU, whereupon that byte may be read back into memory through data-in lines (not shown).

In summary, there has been provided a new and improved video computing system with automatically refreshed memory. More particularly, the subject invention includes a dynamic memory means capable of storing information. A cathode ray tube is operatively connected to the dynamic memory. A cathode ray tube controller is connected to the memory and is capable of sequentially generating addresses corresponding to locations in the memory. A central processing means is connected to the dynamic memory and operates on a two phase, alternating fetch and execute cycle. During each fetch phase, the central processing unit has access to the information in the dynamic memory. During each execute phase, when computing operations are carried out, access to the dynamic memory by the central processing means is prevented. In contrast, during each execute phase, the CRTC is permitted direct access to the memory means enabling the information stored in the memory to be supplied to the CRT. In accordance with the subject invention, the sequential and continuous reading of the memory during each execute phase of the CPU functions to continuously refresh the dynamic memory.

While the subject invention has been described with reference to the preferred embodiments, it is to be understood that various modifications and changes could be made therein by one skilled in the art without varying from the scope and spirit of the subject invention as defined by the appended claims.

I claim:

1. A video computing system with automatically refreshed memory comprising:

dynamic memory means capable of storing information;

display means connected to said dynamic memory means and operating on a raster scanning format;

controller means, operatively connected to said dynamic memory means, for sequentially generating addresses corresponding to locations in said memory means and for reading the information at such locations; and central processing means operatively connected to said dynamic memory means, said central processing means operating on an alternating fetch and execute cycle wherein the controller means and the central processing means are substantially synchronized to operate in sequential fetch and execute cycles and wherein during each fetch phase the central processing means has access to the information in said dynamic memory means during each fetch phase but not during each execute phase, such that during said execute phase, the controller means has direct access to said memory means enabling information stored in the dynamic memory means to be supplied to the display means and wherein the sequential and continuous reading of the memory means during each execute phase functions to continuously refresh the dynamic memory means.

2. A video computing system as recited in claim 1 wherein the storage locations of the dynamic memory means are arranged in a matrix configuration having rows and columns and wherein the location of a particular position in said memory means is defined by the intersection of a particular column and a particular row and wherein reading all of the addresses corresponding to any row or column by the controller means refreshes said memory means.

3. A video computing system as recited in claim 2 wherein each address generated by the controller means comprises a multi-digit number, with the lower order digits corresponding to the addresses of said rows of said memory means and with the higher order digits corresponding to the addresses of the columns of said dynamic memory means such that as the sequential addresses are generated by the controller means, every possible row address is generated for each new column address such that the entire memory is refreshed sequentially while accessing only the memory locations in a single column or row.

4. A video computing system as recited in claim 3 wherein the image on said display means is continuously refreshed by causing the address generated by the controller means to be reset at the termination of a complete raster scan, and wherein the number of rows in said dynamic memory means is less than the largest address generated by the controller means such that the dynamic memory means is refreshed at least once during each complete raster scan of the display means even if said memory means has a number of storage locations greater than necessary to store all the video information.

5. A video computing system as recited in claim 4 further including a multiplexer means connected to said dynamic memory means and supplied with addresses generated by both said central processing means and controller means, said multiplexer means for distributing said addresses to the dynamic memory means.

6. A video computing system as recited in claim 5 wherein the dynamic memory means comprises eight individual dynamic RAM's each connected to said multiplexer means.

7. A video computing system as recited in claim 6 wherein each address supplied to said multiplexer means causes one location in each of said eight dynamic RAM's to be read.

8. A video computing system as recited in claim 7 wherein each of said individual dynamic RAM's is arranged in a matrix configuration with 256 column addresses and 256 row addresses.

9. A video computing system as recited in claim 8 wherein each scan line on the display means comprises 64 bytes of eight bits each, with one bit of each byte being respectively supplied by one of the eight dynamic RAM's each time a particular address is accessed, whereby the scanning of four lines on the display means generates 256 row addresses thereby refreshing each of the individual dynamic RAM's.

10. A method of refreshing the dynamic memory in a video computing system wherein said system includes a dynamic memory means capable of storing information, a display means connected to the dynamic memory means and operating on a raster scanning format, and a central processing means operatively connected to the dynamic memory means and operating on an alternating two phase fetch and execute cycle wherein the controller means and the central processing means are substantially synchronized to operate in sequential fetch and execute phases and wherein the central processing means has access to the information in the dynamic memory during each fetch phase but not during each execute phase, such that during said execute phase, the display means is directly supplied with information stored in the dynamic memory means, said method comprising the step of sequentially and continuously reading the memory means during each execute phase to supply information stored therein to the display means thereby simultaneously refreshing the dynamic memory means.

11. A raster scanning output device for producing a visual display of graphic and/or alphanumeric information by pixel generation on a medium comprising:

Memory means in the form of a matrix, a portion of which is to store information to be displayed by said output device, said memory means requiring periodic refreshing to maintain the information to be stored therein;

Computer means for operation with sequential fetch and execute cycles;

Control means controlling the access of both said computer means and said output device to said memory such that during said fetch cycle said computer means is accessed to the memory means for reading or writing information and during said execute cycle, said output device is accessed to said memory in synchronism with the raster scan in a manner providing information to the output device while simultaneously refreshing the information that is stored in the entire memory.

* * * * *